United States Patent [19]
Wollesen et al.

[11] Patent Number: 5,960,271
[45] Date of Patent: Sep. 28, 1999

[54] SHORT CHANNEL SELF-ALIGNED VMOS FIELD EFFECT TRANSISTOR

[75] Inventors: Donald L. Wollesen, Saratoga; Homi Fatemi, Los Altos Hills, both of Calif.

[73] Assignee: Advanced Micro Devices, Inc., Sunnyvale, Calif.

[21] Appl. No.: 09/042,786

[22] Filed: Mar. 17, 1998

Related U.S. Application Data

[62] Division of application No. 08/714,317, Sep. 18, 1996, Pat. No. 5,808,340.

[51] Int. Cl.⁶ .................................................. H01L 21/336
[52] U.S. Cl. ......................... 438/197; 438/270; 438/271; 438/589
[58] Field of Search ..................................... 438/197, 589, 438/270, 271, 272, 268, 301, FOR 363; 148/DIG. 126

[56] References Cited

U.S. PATENT DOCUMENTS

| | | | |
|---|---|---|---|
| 4,102,714 | 7/1978 | DeBar et al. | 438/237 |
| 4,131,907 | 12/1978 | Ouyang | 257/337 |
| 4,200,968 | 5/1980 | Schroeder | 438/271 |
| 4,227,297 | 10/1980 | Angerstein | 438/271 |
| 4,316,203 | 2/1982 | Tohgei | 148/DIG. 26 |
| 4,502,208 | 3/1985 | McPherson | 438/281 |
| 4,567,641 | 2/1986 | Baliga et al. | 438/201 |
| 4,682,405 | 7/1987 | Blanchard et al. | 438/274 |
| 4,859,621 | 8/1989 | Einthoven | 438/271 |
| 5,016,067 | 5/1991 | Mori | 257/330 |
| 5,371,024 | 12/1994 | Hieda | 438/270 |
| 5,451,805 | 9/1995 | Yang | 257/341 |
| 5,466,616 | 11/1995 | Yang | 438/197 |
| 5,470,770 | 11/1995 | Takahashi et al. | 438/301 |
| 5,474,943 | 12/1995 | Hshieh et al. | 438/270 |
| 5,508,547 | 4/1996 | Yang | 257/343 |
| 5,811,336 | 9/1998 | Kasai | 438/271 |

FOREIGN PATENT DOCUMENTS

| | | | |
|---|---|---|---|
| 54-133078 | 10/1979 | Japan | 257/330 |
| 53-134135 | 5/1980 | Japan | 257/330 |
| 6-21451 | 1/1994 | Japan . | |

OTHER PUBLICATIONS

Sun, S.C.; Plummer, James D., "Electron Mobility in Inversion and Accumulation Layers on Thermally Oxidized Silicon Surfaces," IEEE Transactions On Electron Devices, vol. ED–27, No. 8, Aug., 1980.

Primary Examiner—Michael Trinh
Attorney, Agent, or Firm—Foley & Larnder

[57] ABSTRACT

A field effect transistor with a trench or groove gate having V-shaped walls is formed in a semiconductor substrate and a gate oxide is grown on the V-shaped walls to the surface of substrate and filled with a gate electrode material, such a polysilicon. Preferably, the bottom of the V-shaped walls are rounded before the trench is filled. Source/drain impurities either are diffused or implanted into the areas of the substrate on both sides of the surface oxide of the V-shaped gate. Contacts are made to the source, drain, and gate within field isolation to complete the structure. The resultant FET structure comprises a self aligned V-shaped gate having conventional source and drain surrounded by field isolation but with an effective channel length ($L_{eff}$) of less than about one-half of the surface width of the gate. Preferably, the converging walls of the V-shaped gate end in a rounded concave bottom. Because of the V-shaped structure of the gate, the effective saturated length of the channel with drain voltage applied only extends from the edge of the source to just prior to the tip of the V-shaped structure in the interior of the semiconductor substrate. The drain side of the V-shaped structure becomes a depletion region due to the applied drain voltage. Due to this characteristic of such a structure, the surface width of the gate can be, for example, two or more times the distance of the desired channel length thereby permitting conventional lithography to be used to define the gate lengths much shorter than the lithographic limit.

17 Claims, 4 Drawing Sheets

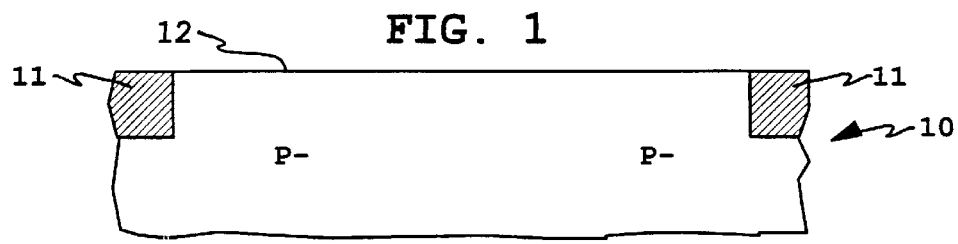
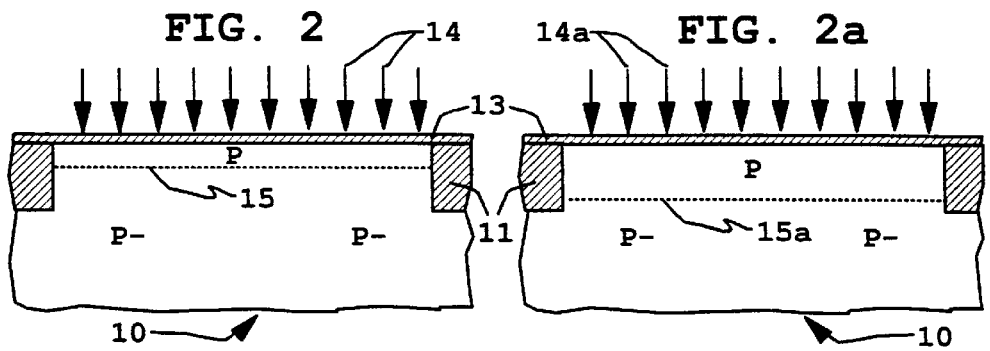
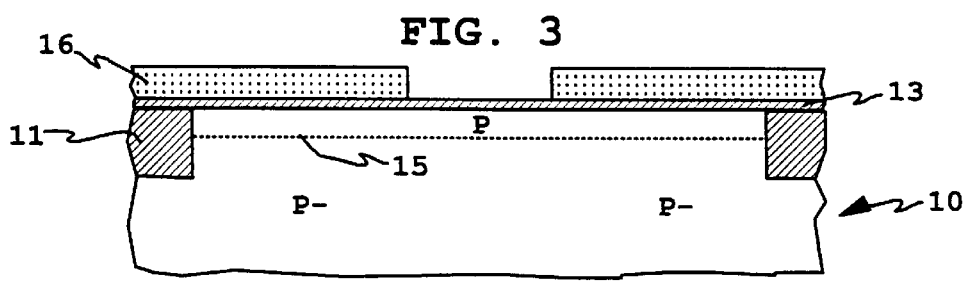
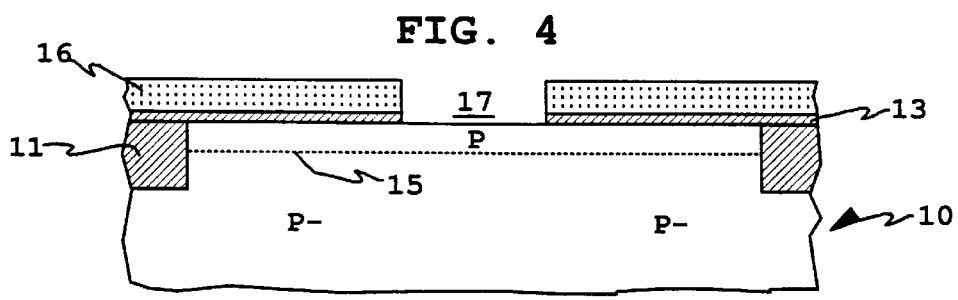
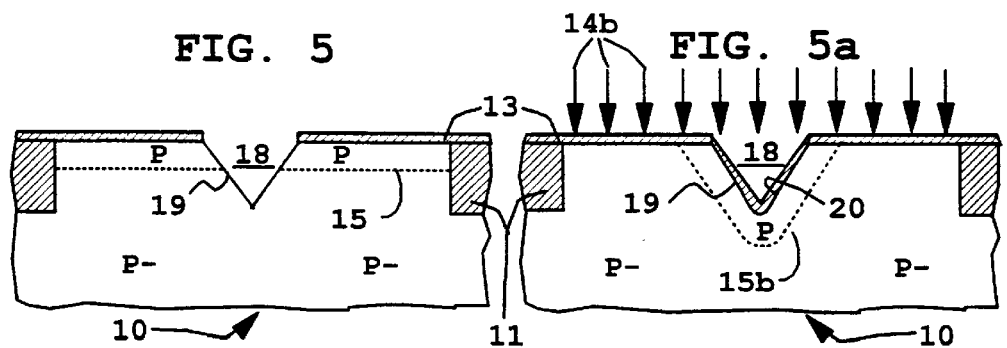

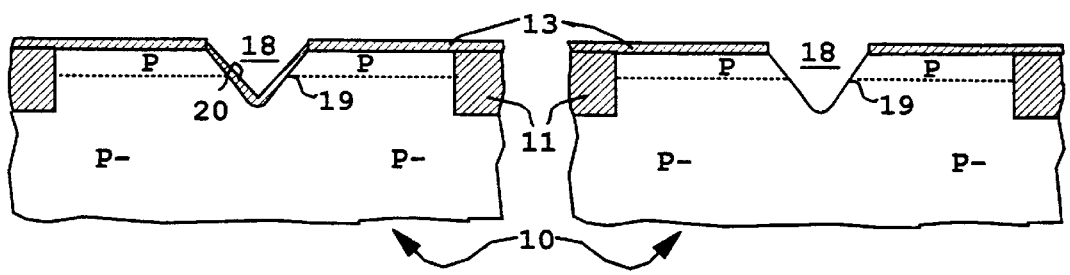
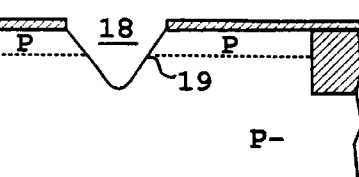
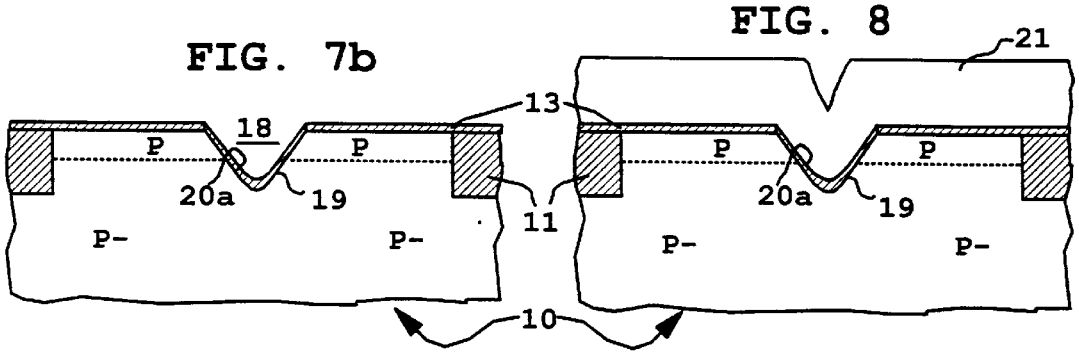
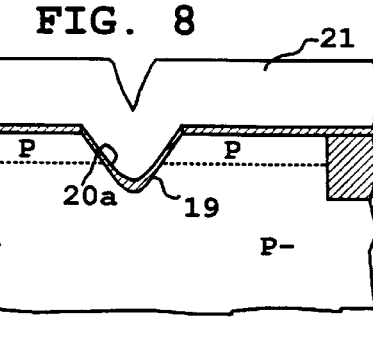
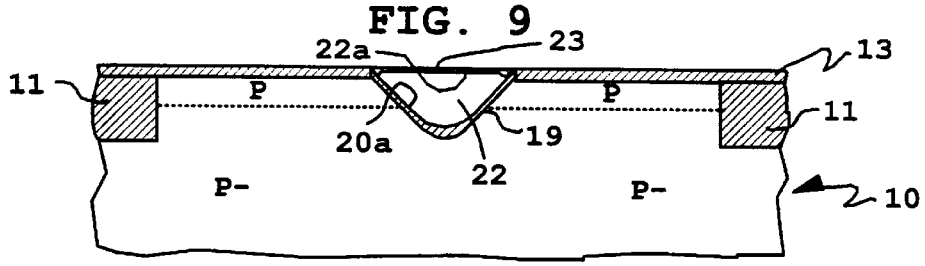
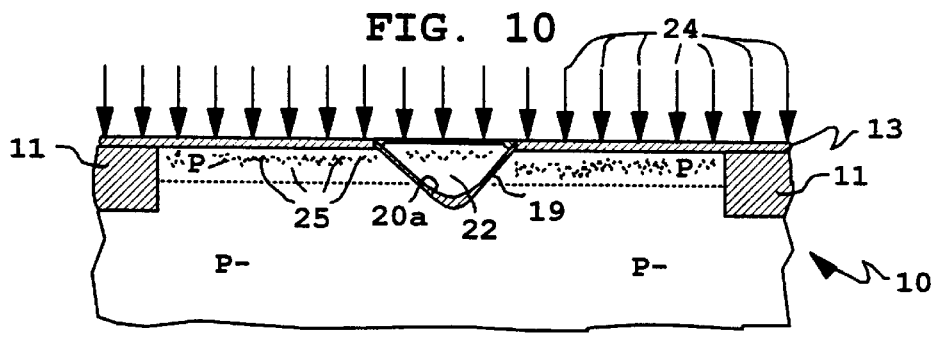
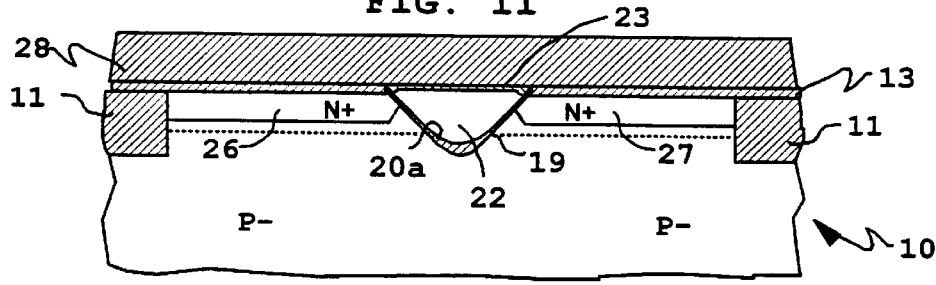

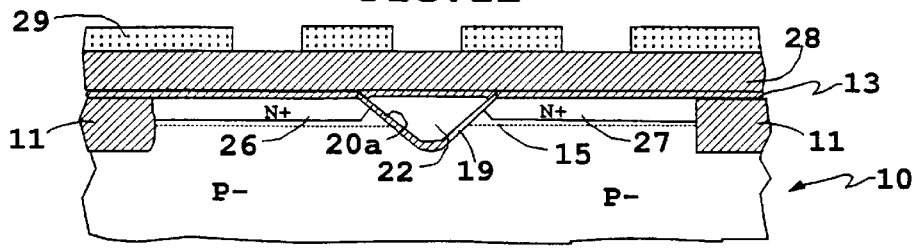
FIG. 12
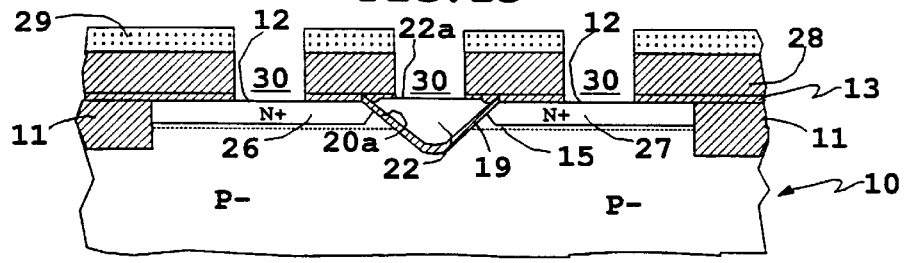
FIG. 13
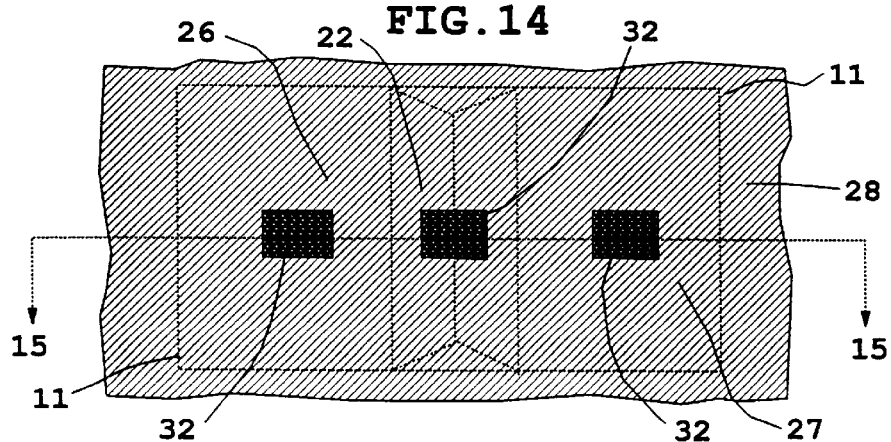
FIG. 14
FIG. 15
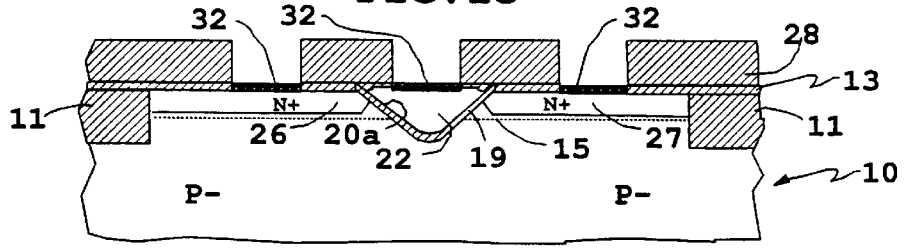
FIG. 16
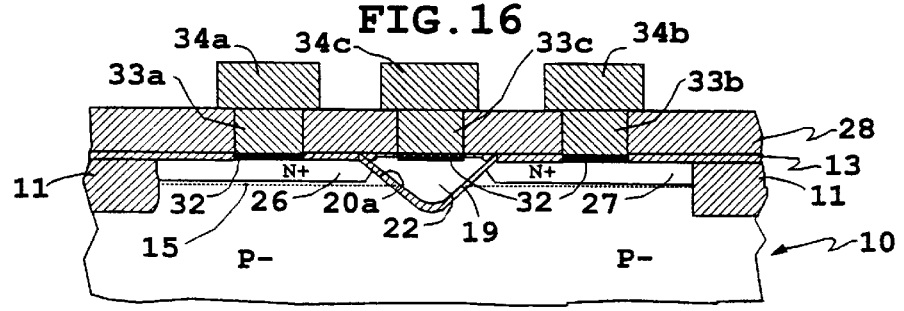

SHORT CHANNEL SELF-ALIGNED VMOS FIELD EFFECT TRANSISTOR

CROSS REFERENCES TO RELATED APPLICATIONS

This application is a division of U.S. patent application Ser. No. 08/714,317, filed Nov. 18, 1996, filed U.S. Pat. No. 5,808,340, entitled SHORT CHANNEL NON-SELF ALIGNED VMOS FIELD EFFECT TRANSISTOR, filed on an even date herewith. This cross referenced application is incorporated by reference into this application.

FIELD OF THE INVENTION

The present invention relates to a field effect transistor and, more specifically, a field effect transistor with an effective channel length of less than a quarter micron and a method of fabricating such field effect transistor.

BACKGROUND OF THE INVENTION

With higher levels of integrated circuits on semiconductor chips and the need for faster transistors in these circuits, the FET transistor in production today, such as a MOSFET, is fabricated with an effective channel length of about $0.5\mu$. To increase the speed of the transistor even faster, the channel length of the FET must be reduced below $0.25\mu$. This dimension approaches the limits of optical lithography and semiconductor manufactures are resorting to techniques like phase shift lithography, which require expensive masks but permit optical lithography to achieve these small line widths, and X-ray lithography which is extremely costly from an exposure equipment and mask making standpoint. Although an electron beam is another alternative, its throughput is extremely slow when it is used in a direct write mode.

SUMMARY OF THE INVENTION

Accordingly, it is an object of the present invention to provide a method manufacturing an integrated circuit with FET transistors with extremely short channel lengths which permits the use of conventional optical lithography.

A further object of the present invention to design the width of a gate electrode of a FET of a dimension to permit conventional optical lithography but with a structure such that it has an effective channel length of less than one-half of the gate width.

Another object of the present invention design is a FET structure with an extremely short channel which does not require lightly doped drains or other double doping to create the source and drain.

In accordance with the present invention, a trench or groove having converging walls is formed in a semiconductor substrate and a gate oxide is grown on the walls to the surface of substrate. Preferably, the bottom of the walls is rounded and the inside angle of the converging walls at the bottom of the trench is in the range of about 66° to about 123°. (Although V-shaped will be described and shown in the drawings, a U-shaped gate also is contemplated by this invention.) A gate material, such as polysilicon or metal, is deposited in and fills the remaining portion of the trench. Source/drain impurities either are diffused or implanted into the areas of the substrate on both sides of the surface oxide of the gate. If desired, the gate, if it is polysilicon, may be doped at the same time and a silicide may be formed on both source/drain regions and the polysilicon to lower the resistivity of these areas. Contacts are made to the source, drain, and gate and insulated from each other to complete the FET structure.

Because of the structure of the gate herein V-shaped, the effective saturated length of the channel with drain voltage applied only extends from the edge of the source to just prior to the tip of the V-shaped structure in the interior of the semiconductor substrate. The drain side of the V-shaped structure becomes a depletion region due to the applied drain voltage. Due to this characteristic of such a structure, the surface width of the gate can be, for example, two or more times the distance of the desired channel length thereby permitting conventional lithography to be used to define the gate lengths much shorter than the lithographic limit.

In accordance with another aspect of the present invention, the resultant FET structure comprises a self aligned gate with converging walls and having conventional source and drains but with an effective channel length ($L_{eff}$) of less than about one-half of the surface width of the gate. Preferably, the bottom of the gate is rounded and the inside angle of the converging walls at the bottom of the trench are in the range of about 66° to about 123°.

BRIEF DESCRIPTION OF THE DRAWINGS

The foregoing and other objects, aspects and advantages will be better understood from the following detailed description of preferred embodiments of the invention with reference in the drawings, in which:

FIG. 1 is a cross-sectional view of a semiconductor substrate doped with an impurity and having recessed field oxidation for transistor isolation.

FIG. 2 is a cross-sectional view of the doped semiconductor substrate having on its surface an oxide layer and being shallow implanted with an impurity for transistor threshold control or adjusting $V_T$.

FIG. 2a is a cross-sectional view of the doped semiconductor substrate having on its surface an oxide layer and being conventionally implanted with an impurity for transistor threshold control adjusting $V_T$.

FIG. 3 is a cross-sectional view of the doped semiconductor substrate having on its surface the oxide layer and a patterned resist material.

FIG. 4 is a cross-sectional view of the doped semiconductor substrate having on its surface the oxide layer with the oxide layer removed in the patterned area.

FIG. 5 is a cross-sectional view of the doped semiconductor substrate having on its surface the patterned oxide layer with a V-shaped trench or groove formed in the substrate.

FIG. 5a is a cross-sectional view of the doped semiconductor substrate being implanted with a conventional $V_T$ impurity adjust after the formation of the V-shaped trench and with an oxide on the walls of a V-shaped trench.

FIG. 6 is a cross-sectional view of the doped semiconductor substrate with the oxide on its surface and also on the walls of the V-shaped trench.

FIG. 7a is a cross-sectional view of the doped semiconductor substrate in the preferred method of removing the oxide growth from the walls of the V-shaped trench.

FIG. 7b is a cross-sectional view of the doped semiconductor substrate with the oxide regrown on the walls of the V-shaped trench.

FIG. 8 is a cross-sectional view of the doped semiconductor substrate having on its surface and on the V-shaped trench walls the oxide layer and a conductive material formed on the oxide layer to serve as a gate.

FIG. 9 is a cross-sectional view of the doped semiconductor substrate with the conductive material in a V-shaped gate trench planarized to be level and in the same plane with the surface of an oxide layer thereon.

FIG. 10 is a cross-sectional view of the doped semiconductor substrate having a source and drain formed in the substrate and on opposite sides of the trench gate.

FIG. 11 is a cross-sectional view of the doped semiconductor substrate having an insulating layer formed on the oxide layer and the conductive gate.

FIG. 12 is a cross-sectional view of the doped semiconductor substrate formed with the source, drain and gate and with the thick insulating layer covered with a patterned resist layer.

FIG. 13 is a cross-sectional view of the doped semiconductor substrate with the oxide and insulating layers above the source and drain regions removed.

FIG. 14 is a plan view of the insulating layer over source, drain, and gate of the doped semiconductor substrate, and a silicide formed in areas of the source, drain and gate.

FIG. 15 is a cross-sectional view of the doped semiconductor substrate with the silicide formed in the areas of the source, drain and gate taken along line 15—15 of FIG. 14.

FIG. 16 is a cross-sectional view of the doped semiconductor substrate with conductors in contact with the silicide formed in the areas of the source and drain.

DETAILED DESCRIPTION OF THE PREFERRED EMBODIMENTS OF THE INVENTION

Figure 17:
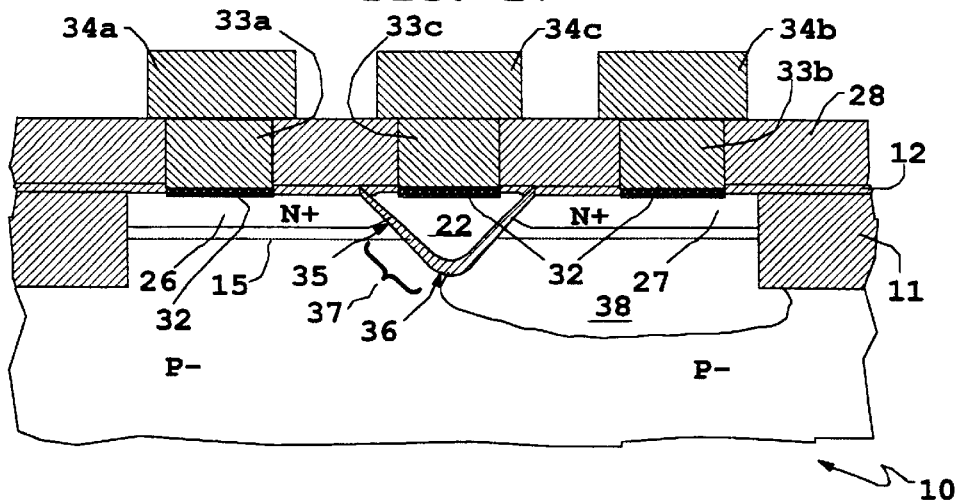
FIG. 17 is an enlarged cross-sectional view of the completed FET having the shallow threshold control implanted impurity of FIG. 2 and with the effective channel length and depletion region depicted during operation.

Referring now to the drawings and starting with FIG. 1, which shows a portion of a semiconductor body 10, herein crystalline silicon doped with a P-impurity, such as boron, for fabricating N-type transistors, and a recessed field isolation oxide region (FOX), 11, to isolate one transistor from another in an integrated circuit. The crystaline silicon body 10 consists of crystallographic planes including a (100) plane, (110) plane and a (111) plane. The upper or top surface 12 of the silicon crystalline body is in the (100) plane. An insulating layer, herein silicon oxide 13 with a thickness in the range of 500 Å to 1000 Å, is grown on the upper surface 11 of the semiconductor body, as shown in FIG. 2 and 2a, by exposing it to oxygen ($O_2$) at a temperature in the range of 800° C. to 900° C. for about 50 minutes.

The present invention preferably is used to fabricate a DMOS field effect transistor (FET) and FIG. 2 shows, by the arrows 14 and the dashed line 15, a shallow and varied $V_T$ implant (which will be further described later) of a P-type impurity, herein boron, at a dosage of about $10^{18}$ and an energy of 20–30 keV. Alternatively, a N impurity of, for example, phosphorus, would be used for a P-type FET. After annealing, preferably by a rapid thermal anneal of 950° C. for 35 minutes, a P impurity region is formed, as illustrated by the dashed line 15 in FIG. 2. A double diffused channel or DMOS channel is preferred so that only shallow diffusion of the P impurity results from the annealing which gives a graded doping away from the source to be formed and which provides a shorter electrical channel length than the physical channel length. This is because the channel length is determined by the lateral diffusion of two complementary diffusions. In addition, the P doping in the channel region is higher than in the drift region which will reduce the channel length modulation and the probability of punch through. Alternatively, FIG. 2a shows, by the arrows 14a and dashed line 15a, a conventional and substantially uniform $V_T$ implant (which will be further described later) of P-type impurity, again boron, for a conventional NMOS VFET using a dosage of about $10^{18}$ at an energy of 60–100 keV. With either embodiment, the next step is to apply a resist material 16, herein a commercially available photoresist and, preferably one which is sensitive to deep ultra violate (UV) light, by spin coating, on the oxide layer 13 and expose and develop the resist to form the pattern shown in FIG. 3. Using a parallel plate reactive ion etcher or any other known ion etching apparatus that etch anisotropically and a gas or gases containing fluorine ions (F−) whose formulation is more selective for silicon oxide than silicon, the oxide layer 13 is etched, as shown in FIG. 4, in the patterned area to the top surface 12 of the semiconductor body 10 which serves as an etch stop. An opening 17 is thus formed in the oxide layer 13.

To form a trench or groove with converging walls, a V-shaped trench 18, preferably, in the semiconductor body 10, it is exposed in the opening 17 to an anisotropic etchant, anisotropic in that it etches the (100) plane in preference to the (111) plane of the silicon body 10. Herein, a solution of hydrazine and water, ethylene-diamine, potassium hydroxide, or, preferably, pyrocatechol is used to preferentially etch the (100) plane and not the (111) plane. The etching stops when all of the (100) plane is consumed and a V-shaped trench or groove 18 with walls 19 is formed, as shown in FIG. 5 and FIG. 5a. The angle of the V-shaped trench 15 is about 57° relative to the surface of silicon body 10. By measuring the depth down either angled side, $D_s$, of the trench for a given opening width, W, $D_s$ then =0.92 W. If the desired gate width is 0.18 μm, the depth of the trench should be about 0.165 μm. If it is desired to form a U-shaped trench or groove, the etching is stopped before consumption of the (100) plane and the bottom of the trench or groove will be flat intercepting the walls 16 at an angle of 123° relative to the surface of the silicon body 10. Instead of implanting the P-type impurity for the conventional and substantially uniform $V_T$ as shown in FIG. 2a, such a $V_T$ impurity adjust can be implanted after the formation of the V trench or groove 18, as shown by the arrows 14b and the dashed line 15b of FIG. 5a, using the about same dosage as described for FIG. 2a but a lower energy of about 20–30 keV and with a screen or sacrificial thermal oxide 20 grown on the walls 19 with the shallow P implant.

With the trench or groove 18 formed as shown in FIG. 5, preferably in a V-shape, a sacrificial thermal oxide 20 is grown on the walls 19 as shown in FIG. 6, using similar oxidation conditions as described above for the oxide layer 13 but modified to grow a thinner oxide layer; for example, the conditions being at around 950° C. for about 20 minutes so as to grow an oxide thickness of about 60 Å to 80 Å for a planned effective channel length of 0.1 μm. Sacrificial oxides, either thinner or thicker than this example, may be used.

Preferably, as shown in FIG. 7a and 7b, the sacrificial oxide 20 (FIG. 6) is a thermal oxidation which may be thicker than 80 Å since it is removed after being grown as shown in FIG. 7a. Oxidation of the walls 19 of the V-shaped trench causes the bottom 19a of the V-shaped trench to round which has be found beneficial to the performance of the present invention. Oxide layer 13 should be substantially thicker than sacrificial oxide 20, so that after removal of layer 20, there is still a portion of layer 13 remaining. Accordingly, the sacrificial oxide 20 of FIG. 6 is removed by wet and preferably dry etching using the reactive ion etcher and etchants described for making the opening 18 in the surface oxide 13. After removal, a gate oxide 20a, equal to or thinner than the thickness of the removed or sacrificial oxide 20 (FIG. 6) and preferably about 80 Å, is thermally grown using the conditions described above for oxide 20. These two oxidations of the walls or sides 19 of the V-shaped trench 18 provides sufficient rounding of the bottom 19a to reduce peak electric field strength, during operation, which will improve gate oxide breakdown and device operation.

A gate electrode material is deposited in the V-shaped trench 18 with the gate oxide 20a as shown in FIG. 8. Polysilicon is the preferred gate electrode material and it can be deposited from a silicon precursor, such as silane ($SiH_4$), either undoped, or doped at the time of deposition by incorporating in with the silane gate an impurity precursor, such as diborane for boron (B) and phosphine for phosphorus (P) depending on the type of impurity and whether a N-type of P-type transistor is being fabricated. Preferably, an undoped polysilicon 21 is chemically vapor deposited (CVD) on the oxide layers 13 and 20a in an amount to more than fill the V-shaped trench 18 as shown in FIG. 8.

Next, the polysilicon 18 is planarized, preferably by chemical/mechanical polishing with a slurry know in the art with a higher selectivity for polysilicon than silicon oxide to form a gate 22. The polishing removes the polysilicon material 21 on the upper surface of oxide layer 13 which serves as an etch stop for planarizing the polysilicon level therewith. A V-shaped polysilicon 22 or, alternatively, polycide or metal gate if desired, is thus formed and, when doped, will become a gate electrode. To protect the gate 22 during further processing and to provide a screen oxide during subsequent implantation, an oxide layer 23 is grown on the surface 22a of the polysilicon gate 22, as shown in FIG. 9.

To create the source and drain which, for purposes of this description of the fabrication of a N-type DMOS, N+ impurities, herein arsenic (As) (or alternatively P+ impurities for a P-type, herein boron), is used for fabricating an N-type (or alternatively P-type) FET transistor. Herein, the ions are implanted, as shown in FIG. 10, by the arrows 24 and the ions are depicted by numeral 25 in the semiconductor body 10. Since the polysilicon material 21 was preferably undoped prior to source-drain implant, this implant also dopes the gate 22. The implantation is carried out at an energy of 50 keV and with a dosage of $2\times10^{15}$ for arsenic or, alternatively, 25 keV with a dosage of $1\times10^{15}$ for boron. To repair any implant damage to the semiconductor body 10, to activate the ions and to vertically and laterally diffuse the ions, the semiconductor body 10 is annealed at a temperature of 900° C. for 10 minutes to yield the metallurgical junctions or diffusion profiles of the source 26 and drain 27 as shown in FIG. 11 and also to cause vertical diffusion in the now doped polysilicon gate electrode 22. When a polysilicon or polycide gate is used, the gate material may be doped heavily (e.g. with phosphorous for N-type) prior to the source and drain implant so that, if the implanted impurity is opposite in type, the source/drain doped implant cannot convert the gate doping. Although this description is specific to N-type transistor, the present invention contemplates P-type and complementary FETs and other types of FETs.

With the source 26, drain 27 and gate 22 now fabricated, the remaining steps are dedicated to forming the contacts to the source, drain and gate separated by insulation as will be described in conjunction with FIGS. 11 through 16. In FIG. 11, an insulating layer is deposited on the oxide layer 13 and the oxide 23 on the gate 22, preferably by CVD depositing a conformal silicon oxide precursor, such as tetraethylorthosilicate (TEOS) or tetramethylcyclotetrasilane to form silicon oxide as layer 28. A resist layer 29, again a commercially available photoresist and a sensitizer, is formed on the oxide layer 28 by spin coating, followed by exposure and development to create the pattern shown in FIG. 12. Using this pattern and as shown in FIG. 13, openings 30 are made to the source, drain and gate regions by etching the oxide layer 24 using dry anisotropic etching as previously described for etching the oxide layer 13. The etchant gas or gases have a higher selectivity for oxide over silicon so that the silicon body 10 serves as an etch stop at the surface 12 of the silicon body and the surface 22a of the polysilicon gate 22. Next, a metal capable of forming a silicide is deposited in the openings 30 either as a metal silicide or, preferably is deposited as the metal, such a titanium (Ti), and is reacted with the exposed silicon and polysilicon surfaces to form titanium silicate ($TiSi_2$) 32 on the source 26 and drain 27 and on the polysilicon gate electrode 22 as shown in the plan view of FIG. 14 and in the cross-sectional view of FIG. 15. The outer area in dashed lines shown in FIG. 14 is the field oxide isolation region or FOX 11 which surrounds the source region 26, drain region 27 and the gate electrode region 22. The V-shaped trench of the gate electrode 22 is shown in dashed lines between the source and drain regions 26 and 27. Conductive contacts 33a, 33b and 33c are made to titanium silicide 32 of the source 26, drain 27, and gate region 22, respectively, and fill the openings 30 by either sputtering or preferably by CVD of a conductive material, herein tungsten or aluminum. With the N-type DMOS FET completed, a level of metallization is formed on the insulating layer 28 with conductive lines 34a, 34b and 34c such as aluminum connecting contacts 33a, 33b and 33c of the source 26, the drain 27 and the gate 22, respectively, for connecting the FET to active and passive devices in an integrated circuit. These conductive lines may be covered with an insulating material (not shown) and additional levels of metallization with connecting vias may be formed as is well known in the integrated circuit art.

Figure 17A:
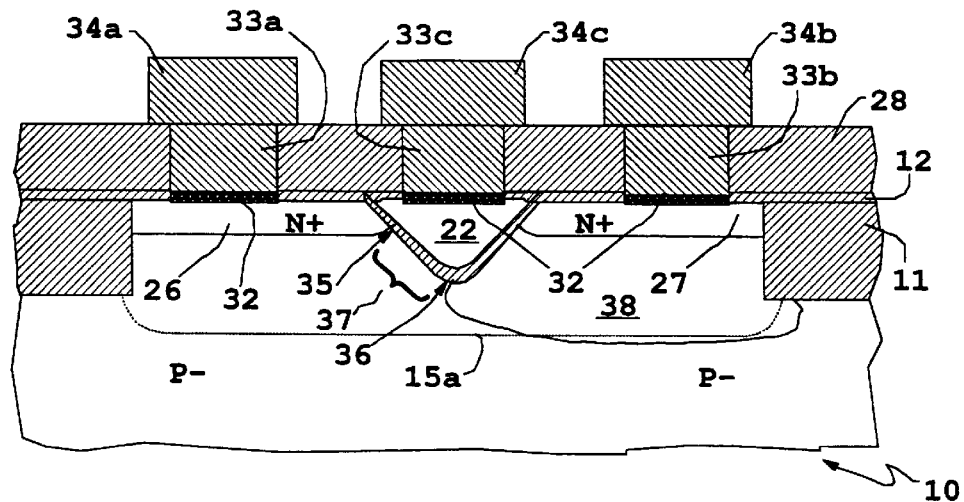
FIG. 17a is an enlarged cross-sectional view of the completed FET having the convention threshold control implanted impurity of FIG. 2a and with the effective channel length and depletion region depicted during operation.
Figure 17B:
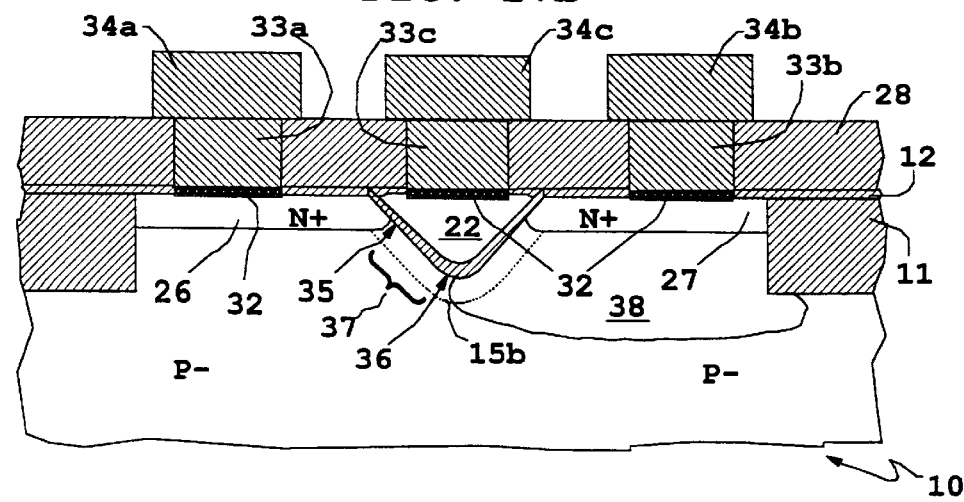
FIG. 17b is an enlarged cross-sectional view of the completed FET having the convention threshold control implanted impurity of FIG. 5a and with the effective channel length and depletion region depicted during operation.

To more fully understand the present invention, FIG. 17 depicts a DMOS having a shallow and varied $V_T$ adjustment 15, shallow in that, after annealing, the diffused implant extends from slightly below the source 26 and drain 27 profile or metallurgical junctions and to a point above the tip of the V-shaped gate 22, and varied in that the concentration of the impurity varies along the channel with the lightest concentration being at its deepest point in the silicon body 10. With a voltage applied to the drain electrode, such as 2 volts to the gate 22, and a bias voltage applied to the substrate 10. Because of the V-shape of the gate electrode 22, the effective length of the channel only extends from the edge 35 of the source's metallurgical junction to approximately at the tip 36 of the V-shaped gate electrode 22 as illustrated by the bracket (}) 37. On the drain side of V-shaped gate electrode, a large depletion region 38 forms when this device is operating in its saturation region. FIGS. 17a and 17b illustrate two NMOS VFETs with conventional P-type implantation and with the $V_T$ impurity adjust 15a of FIG. 17a extending substantially uniform between the FOX 11 below the tip of the V-shaped gate electrode 22, and with the $V_T$ 15b of FIG. 17b extending substantially uniform and surrounding the V-shaped gate to a point below the tip of the gate. Substantially uniform in both the FIG. 17a and 17b embodiments means that the concentration of the impurities along the channel 37 is uniform because the impurities are diffused below the tip of the V-shaped gate 22.

The major advantage that can be taken from this restricted effective channel length ($L_{eff}$) due to the V-shaped gate electrode in FIGS. 17, 17a and 17b of the present invention is that a gate width can be lithographically formed more than two and as great as five times larger than the desired effective channel length ($L_{eff}$) For example, if a channel length ($L_{eff}$) as short as 0.06 μm is desired, with an N+ junction depth of 1,000 Angstroms, only a gate width of 0.18 μm would have to be fabricated, which is within present day optical lithography limits. Moreover, the present invention is extendable beyond optical lithography and if X-ray lithography were used to fabricate a gate width of 0.09 μm, the effective channel length ($L_{eff}$) with the V-shaped gate electrode of the present invention would be 0.03 μm.

Although this invention has been described relative to specific materials, and apparatuses for depositing and etching doping these materials, it is not limited to the specific materials or apparatuses but only to their specific characteristics. Other materials and apparatus can be substituted for those described herein which will be well understood by those skilled in the microelectronics and semiconductor arts after appreciating the present invention. Further, even though the preferred embodiments have been illustrated as a N-type or N-channel FET, those skilled in the art will recognize that, by reversing all the dopants from N to P and from P to N, P-type or P-Channel FETs or devices can be fabricated and, with additional process steps known in the art, both N-Channel and P-Channel transistors can be fabricated for CMOS and BiCMOS applications.

Having thus described the invention, what is claimed is:

1. A process of fabricating a short channel length field effect transistor (FET) comprising the steps of:
   forming an insulating layer on a semiconductor substrate having an upper surface and with at least two crystalline planes, one plane being (100) and parallel with the upper surface and the other plane being (111);
   forming an opening in said insulating layer;
   forming a V-shaped trench in said substrate having a bottom in the substrate interior at the opening in the insulating layer by etching the substrate with an etchant having a preference for the (100) crystalline plane over the (111) crystalline plane, said trench having angled side walls converging toward each other at said bottom and forming said V-shaped trench with a rounded concave surface at the bottom and a top at the substrate surface having a width extending from one side wall to the other side wall;
   forming a thin insulating layer on the angled side walls and a thicker insulating layer at said rounded concave surface of said trench having a lower side in contact with the substrate and an upper side;
   filling the trench, with a material capable of being conductive and function as a gate of the FET, from the bottom to the top of the trench and having a top surface and a gate width at the substrate surface substantially the same as the width of the top of the trench;
   forming source and drain regions in the substrate on opposite sides of the trench and, each having a metallurgical junction with an inner edge abutting one of the side walls of the trench to create a channel under the gate,
   insulating the source, drain and gate from each other with an insulating material; and
   forming conductive contacts to each of the source, drain and gate, the contacts being separated by an insulating material.

2. The method of claim 1 wherein, prior to forming said trench, a shallow diffusion region, of an opposite impurity type from the impurity of the source and drain, is formed in the semiconductor substrate as a channel diffusion and extends from below the source and drain to above the bottom of the gate and varies in concentration along the channel.

3. The method of claim 1 wherein, prior to the forming the trench, a diffusion region of an opposite impurity from the impurity of the source and drain is formed in the semiconductor substrate and extend from below the source and drain to below the bottom of the gate and is substantially uniform in concentration along the channel.

4. The method of claim 1 wherein, after the formation of said trench but prior to the filling of the trench, a diffusion region of an opposite impurity from the impurity of the source and drain is formed in the semiconductor substrate and surrounds the trench in a substantially uniform concentration and extends to a point below the top of the gate.

5. The method of claim 1 wherein the rounded concave bottom of the V-shaped trench is formed by forming, removing and reforming the gate insulating layer on the side walls of the trench at least once.

6. The method of claim 1 wherein the rounded concave bottom of the V-shaped trench is formed by growing a sacrificial oxide on the trench side walls, removing the oxide and growing the gate oxide on trench side walls.

7. The method of claim 1 wherein, prior to forming the conductive contacts, a metal silicide is formed in the semiconductor substrate of the source and drain regions and on the gate region, the metal silicide underlying the to-be formed conductive contacts.

8. The method of claim 1 wherein said gate material is polysilicon end is doped with an impurity during the formation of the source and drain.

9. The method of claim 1 includes the step of applying a voltage to said drain to form a channel between the metallurgical edge of said source adjacent the gate and the bottom of the trench, said channel being of a length of less than about one-half of the gate width at the surface of the substrate.

10. In a method of fabricating a short channel length V-shaped trench field effect transistor (VFET) in a semiconductor substrate and having a gate width at the surface of the substrate wherein, when a voltage is applied to form a channel, the channel is a length of less than one-half of said gate width, comprising the steps of:
   forming an insulating layer on a semiconductor substrate having an upper surface and with at least two crystalline planes, one plane being (100) and parallel with the upper surface and the other plane being (111);
   forming an opening in said insulating layer;
   forming a V-shaped trench in said substrate having a bottom in the substrate interior at the opening in the insulating layer by etching the substrate with an etchant having a preference for the (100) crystalline plane over the (111) crystalline plane, said trench having angled side walls converging toward each other at said bottom and forming said V-shaped trench with a rounded concave surface at the bottom and a top at the substrate surface having a width extending from one side wall to the other side wall;
   forming a thin insulating layer on the angled side walls and a thicker insulating layer at said rounded concave surface of said trench having a lower side in contact with the substrate and an upper side;

filling the trench, with a material capable of being conductive and function as a gate of the VFET, from the bottom to the top of the trench and having a top surface and a gate width at the substrate surface substantially the same as the width of the top of the trench;

forming source and drain regions in the substrate on opposite sides of the trench and, each having a metallurgical junction with an inner edge abutting one of the side walls of the trench to create the channel under the gate, insulating the source, drain and gate from each other with an insulating material; and forming conductive contacts to each of the source, drain and gate, the contacts being separated by an insulating material.

11. The method of claim 1 wherein, prior to forming said trench, a shallow diffusion region, of an opposite impurity type from the impurity of the source and drain, is formed in the semiconductor substrate as a channel diffusion and extends from below the source and drain to above the bottom of the gate and varies in concentration along the channel.

12. The method of claim 10 wherein, prior to the forming the trench, a diffusion region of an opposite impurity from the impurity of the source and drain is formed in the semiconductor substrate and extend from below the source and drain to below the bottom of the gate and is substantially uniform in concentration along the channel.

13. The method of claim 10 wherein, after the formation of the trench but prior to the filling of the trench, a diffusion region of an opposite impurity from the impurity of the source and drain is formed in the semiconductor substrate and surrounds the trench in a substantially uniform concentration and extends to a point below the top of the gate.

14. The method of claim 10 wherein the rounded concave bottom of the V-shaped trench is formed by forming, removing and reforming the gate insulating layer on the side walls of the trench at least once.

15. The method of claim 14 wherein the rounded concave bottom of the V-shaped trench is formed by growing a sacrificial oxide on the trench side walls, removing the oxide and growing the gate oxide on trench side walls.

16. The method of claim 10 wherein, prior to forming the conductive contacts, a metal silicide is formed in the semiconductor substrate of the source and drain regions and on the gate region, the metal silicide underlying the to-be formed conductive contacts.

17. The method of claim 10 wherein said gate material is polysilicon and is doped with an impurity during the formation of the source and drain.

* * * * *